US006255900B1

(12) United States Patent
Chang et al.

(10) Patent No.: US 6,255,900 B1
(45) Date of Patent: Jul. 3, 2001

(54) RAPID ON CHIP VOLTAGE GENERATION FOR LOW POWER INTEGRATED CIRCUITS

(75) Inventors: Kuen-Long Chang, Taipei; Chun-Hsiung Hung, Hsinchu; Ken-Hui Chen, Tai-Chung; Tien-Shin Ho, Hsin-Tien; I-Long Lee, Hsinchu; Tzeng-Hei Shiau, Hsin-Pu, all of (TW); Ray-Lin Wan, Fremont, CA (US)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/284,435

(22) PCT Filed: Nov. 18, 1998

(86) PCT No.: PCT/US98/24766

§ 371 Date: Apr. 12, 1999

§ 102(e) Date: Apr. 12, 1999

(87) PCT Pub. No.: WO00/29919

PCT Pub. Date: May 25, 2000

(51) Int. Cl.$^7$ ....................................................... G05F 1/10
(52) U.S. Cl. ............................................. 327/589; 327/540
(58) Field of Search ..................................... 327/536, 589, 327/390, 537, 538, 540

(56) References Cited

U.S. PATENT DOCUMENTS

| 5,034,625 | 7/1991 | Min et al. .......................... 307/296.2 |
| 5,511,026 | 4/1996 | Cleveland et al. ............... 365/189.09 |
| 5,629,646 | * 5/1997 | Menezes et al. ...................... 327/536 |
| 5,663,926 | 9/1997 | Haseo ............................... 365/230.06 |
| 5,668,758 | 9/1997 | Yiu et al. .......................... 365/185.23 |
| 5,796,293 | 8/1998 | Yoon et al. ........................... 327/536 |
| 5,877,651 | * 3/1999 | Furutani .............................. 327/536 |
| 6,052,022 | * 4/2000 | Lee ..................................... 327/536 |

OTHER PUBLICATIONS

Chen, et al., "A 2.7V only 8Mbx16 NOR Flash Memory," 1996 Symposium on VLSI Circuits Digest of Technical Papers, IEEE 1996.

* cited by examiner

*Primary Examiner*—Jung Ho Kim
(74) *Attorney, Agent, or Firm*—Mark A. Haynes; Haynes & Beffel LLP

(57) ABSTRACT

An on chip voltage generation circuit is provided suitable for use on integrated circuits such as flash memory devices with a low power supply voltage (e.g., 2.7 to 3.6 volts). A voltage boost circuit is coupled to the supply voltage input and to a boost signal, which boosts the on-chip voltage at a node on the integrated circuit in response to a transition of the boost signal. The voltage boost circuit has a first mode which in response to the transition boosts the on-chip voltage at a first rate of boosting until a first threshold, and a second mode which in response to the transition boosts the on-chip voltage at a second rate of boosting until a second threshold. The second rate of boosting in the preferred system is slower than the first rate of boosting. A detection circuit is coupled to the node on the integrated circuit which receives the on-chip voltage, and to the voltage boost circuit. The detection circuit signals the voltage boost circuit when the node reaches the first threshold, and signals the voltage boost circuit when the node reaches the second threshold. According to one aspect of the invention, the first threshold is reached within less than 5 nanoseconds, and more preferably about 2 nanoseconds, or less, of the transition in the boost signal.

16 Claims, 8 Drawing Sheets

RAPID ON CHIP VOLTAGE GENERATION FOR LOW POWER INTEGRATED CIRCUITS

BACKGROUND OF THE INVENTION

1. Field of the Invention

The present invention relates to on chip voltage generation techniques for producing a voltage on chip which is outside the range of a power supply voltage supplied to the chip; and more particularly to the generation of wordline voltages on low power memory devices like flash memory, mask ROM, and SRAM, where the power supply voltage may be less than the read potential required for sensing data in the memory.

2. Description of Related Art

Integrated circuits have in the past been manufactured in order to work with a power supply voltage of about 5 volts, within a specified range of +/−10%. Of course other power supply voltages have been utilized. There is a current trend for many applications to design integrated circuits to work with lower power supply voltages. Lower voltages generally result in lower power operation for the devices, and are easier to supply using batteries in small devices. For example, one low supply voltage which is emerging as a standard is specified to operate over a range of about 2.7 to 3.6 volts. Other standards are being developed around even lower voltages.

On chip circuits however are often designed to operate at higher voltages for some purposes. For example, in memory devices, such as flash memory, wordlines which supply a gate potential to memory cells are often designed to operate at a read potential of 4 volts or more. Thus, the low power supply voltage is insufficient to supply directly an on chip voltage high enough to drive the wordlines. This problem is dealt with by including charge pumps or other voltage supply boosters on the integrated circuits in order to supply the higher working voltages on chip. See for example U.S. Pat. No. 5,511,026 entitled BOOSTED AND REGULATED GATE POWER SUPPLY WITH REFERENCE TRACKING FOR MULTI-DENSITY AND LOW VOLTAGE SUPPLY MEMORIES. The '026 patent describes an integrated circuit memory having charge pumps configured to supply wordline voltages at a level higher than the supply potential. Furthermore, the '026 patent describes the use of on chip charge pumps to provide a plurality of wordline voltages for multi-level/memory devices, so that a greater working margin is provided between the memory cell states, than would be normally available using a standard supply potential.

One problem associated with the prior art approaches to on chip charge pumps for these purposes arises from the difficulty of producing a well regulated output level without sacrificing speed. Well regulated levels are particularly important in multiple level per cell memory devices, or low voltage devices which operate with a narrow margin for the read voltage. However, it is desirable to read quickly. The time required to settle a charge pump output on a well regulated level can contribute a significant portion of delay to a read operation, or other operation requiring a charge pump generated output for operation.

Accordingly, it is desirable to provide a on chip voltage supply circuit for use with integrated circuits that provides for more precise control of the on chip voltage and which operates quickly.

SUMMARY OF THE INVENTION

The present invention provides an on chip voltage generation circuit suitable for use on integrated circuits such as flash memory devices with a low power supply voltage (e.g., 2.7 to 3.6 volts). According to one aspect of the invention, it can be characterized as an integrated circuit having a supply voltage input adapted to receive a supply potential within a pre-specified range of voltages, and including components on the integrated circuit that use an on chip voltage higher than the pre-specified range for the supply voltage. A voltage boost circuit is coupled to the supply voltage input and to a boost signal, which boosts the on-chip voltage at a node on the integrated circuit in response to a transition of the boost signal. The voltage boost circuit has a first mode which in response to the transition boosts the on-chip voltage at a first rate of boosting until a first threshold, and a second mode which after reaching the first threshold, boosts the on-chip voltage at a second rate of boosting until a second threshold. The second rate of boosting in the preferred system is slower than the first rate of boosting. A detection circuit is coupled to the node on the integrated circuit which receives the on-chip voltage, and to the voltage boost circuit. The detection circuit signals the voltage boost circuit when the node reaches the first threshold, and signals the voltage boost circuit when the node reaches the second threshold. According to one aspect of the invention, the first threshold is reached within less than 5 nanoseconds, and more preferably less than 2 nanoseconds of the transition in the boost signal.

According to one aspect of the invention, the detection circuit includes a first detector which supplies a first control signal to the voltage boost circuit within a first time interval of the node reaching the first threshold. During the first time interval, the voltage boost circuit continues boosting at the first rate. A second detector is coupled to the node, and supplies a second control signal to the voltage boost circuit within a second time interval of the node reaching the second threshold. During the second time interval, the voltage boost circuit continues boosting at the second rate, so that the on-chip voltage at the node increases less during the second time interval than during the first time interval. This slower increasing during the interval between the second detector detecting the second threshold, and the signaling of the voltage boost circuit, enables more precise control of the turn-off of the voltage boost circuit in response to the passing of the second threshold. This allows very fast boosting during the initial part of the pumping of the voltage in response to a single transition, while maintaining a precise cutoff.

According to other aspects of the invention, the voltage boost circuit comprises a capacitor, and a driving circuit coupled to one terminal of the capacitor. The driving circuit supplies the transition to the capacitor by supplying current at a first rate during the first mode, and supplying current at a second rate during the second mode. In one approach, the driving circuit comprises an inverter having an input connected to receive the boost signal and an output coupled to the capacitor. The inverter has first and second power supply terminals, and a current source coupled to one of the first and second power supply terminals having a first mode supplying current at the first rate, and a second mode supplying current at the second rate. In this way, the rate of increase of the voltage on the capacitor can be controlled in the first and second modes to establish the faster and slower rates of pumping.

According to another aspect of the invention, the voltage boosting circuit comprises a first stage and a second stage. The first stage includes a capacitor having a first and second terminals, a diode having an anode coupled to the second terminal capacitor and a cathode coupled to the node on the integrated circuit. A driver is coupled to the first terminal of the capacitor and supplies a first transition signal to the first capacitor. The second stage includes a second capacitor having a first terminal coupled to the node on the integrated circuit. A second driver is coupled to a second terminal of the second capacitor and supplies the transition of the boost signal to the second terminal of the capacitor according to the two modes of operation as discussed above.

In one aspect of the invention, the circuit also includes a first pre-charge circuit coupled to the anode of the diode in the first stage, and a second pre-charge circuit coupled to the cathode of the diode.

In addition, the circuit according to a preferred embodiment includes logic on the chip which is adapted to produce the first transition signal and the transition of the boost signal.

The present invention is particularly suited for implementation on integrated circuit memory including an array of memory cells a plurality of wordlines and a plurality of bitlines. A set of wordline drivers is coupled to the plurality of wordlines and utilizes a wordline voltage higher than the pre-specified range of the supply voltage input. Logic detects an event on the integrated circuit, such as an address signal transition, and produces a transition of a boost signal. A voltage boost circuit and detection circuit as described above are included on the chip to manage the boosting of the wordline voltage. According to one aspect of the invention, the integrated circuit memory comprises an array of ROM cells. In another aspect, the array of memory cells comprises floating gate memory cells, such as flash memory.

Other aspects and advantages of the present invention can be seen upon review of the figures, the detailed description and the claims which follow.

DETAILED DESCRIPTION

Figure 1:
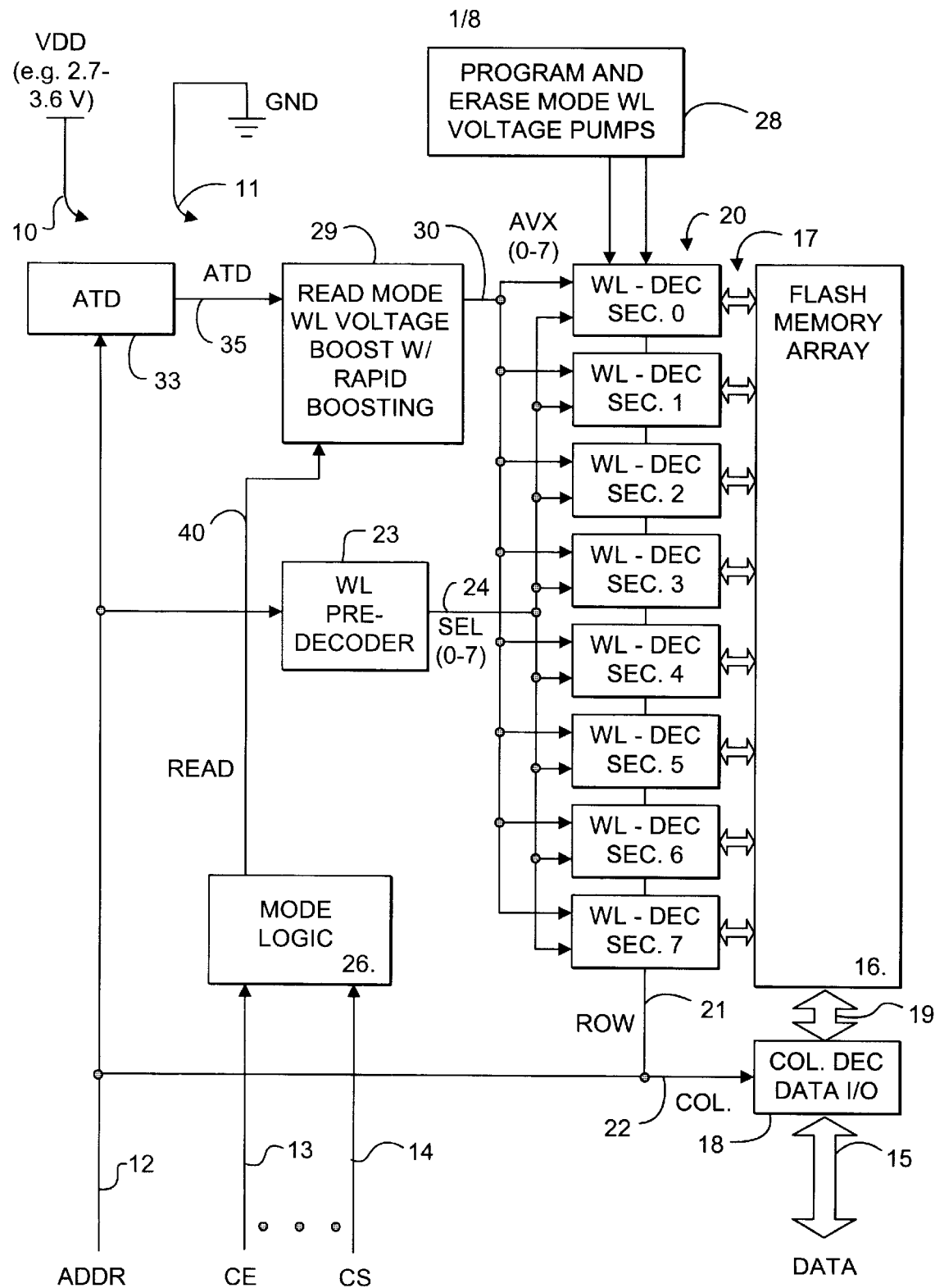
FIG. 1 is a block diagram of an integrated circuit memory device including the on chip voltage supply circuit of the present invention.

The detailed description of the embodiments of the present is provided with respect to FIGS. 1–9, in which FIG. 1 provides an overview of a flash memory device incorporating the on chip voltage supply circuit for generating read mode wordline voltages. Thus, FIG. 1 illustrates an integrated circuit. The integrated circuit includes a supply voltage input 10 adapted to receive a supply voltage VDD. The supply voltage in one example embodiment is 2.7 to 3.6 volts. Also, a ground input 11 is provided. Other input and output pins are included on the integrated circuit including address inputs 12, control signal inputs such as a chip enable input 13 and an output enable input 14, and data input/output pins 15.

The integrated circuit includes a flash memory array 16 including floating gate transistors, an array of ROM cells, such as mask ROM cells, or other memory cells. The array 16 includes a plurality of wordlines represented for example by the arrows 17. The wordlines are driven by a wordline decoder that includes a plurality of sections, including wordline decoder section 0, wordline decoder section 1, wordline decoder section 2, wordline decoder section 3, wordline decoder section 4, wordline decoder section 5, wordline decoder section 6, and wordline decoder section 7 in this example. Also, a column decoder and data input/output circuit 18 is coupled to a plurality of bitlines represented by arrows 19 in the array 16. The column decoder 18 and the wordline decoder 20 are controlled by addresses received from the address inputs 12. The address can be characterized as including row addresses on line 21 and column addresses on line 22 which drive the wordline decoder 20 and the column decoder 18 respectively. Also, a wordline predecoder 23 is included which is coupled to the address line 12. The wordline predecoder generates select control signals SEL(0–7) on line 24 which are supplied respectively to the wordline decoder sections 0–7. In this example, three of the more significant bits of the row address portion of the address on line 12 are used to control the wordline predecoder 23 and select a particular wordline decoder section from the wordline decoder 20.

Mode logic 26 is included on the chip. The mode logic 26 receives the chip enable and chip select signals on lines 13 and 14, as well as other signals in order to control the mode of operation of the flash memory. Flash memory devices include a read mode, a program mode, an erase mode, and other modes as suits a particular implementation for program and erase operations. A READ control signal on line 40 is generated by the mode control logic 26. Program and erase mode wordline voltage pumps 28 are included on the chip. For the read mode, a read mode wordline voltage boost circuit 29 is included. According to the present invention, the read mode wordline voltage boost circuit 29 includes a rapid, multi-stage boost circuit. The output of the read mode wordline boost circuit 29 includes a wordline voltages AVX(0–7) on line 30 for the respective wordline decoder sections. According to the present invention, the read mode wordline voltage boost circuit 29 is responsive to the level of AVX 30. Also, the read mode wordline voltage boost circuit 29 is responsive to address transition detection circuit 33. The address transition detection circuit 33 generates a signal on line 35 which indicates the transition of the address.

Thus, the present invention is applied as shown in FIG. 1 for wordline voltage generation for the read mode of a flash memory device. The invention is particularly suited for flash memory with low power supply voltage in the range for example of 2.7 to 3.6 volts. The invention is also suitable for ROM arrays and for other devices requiring a boosted voltage on a node, such as node 30, on the integrated circuit.

Figure 2:
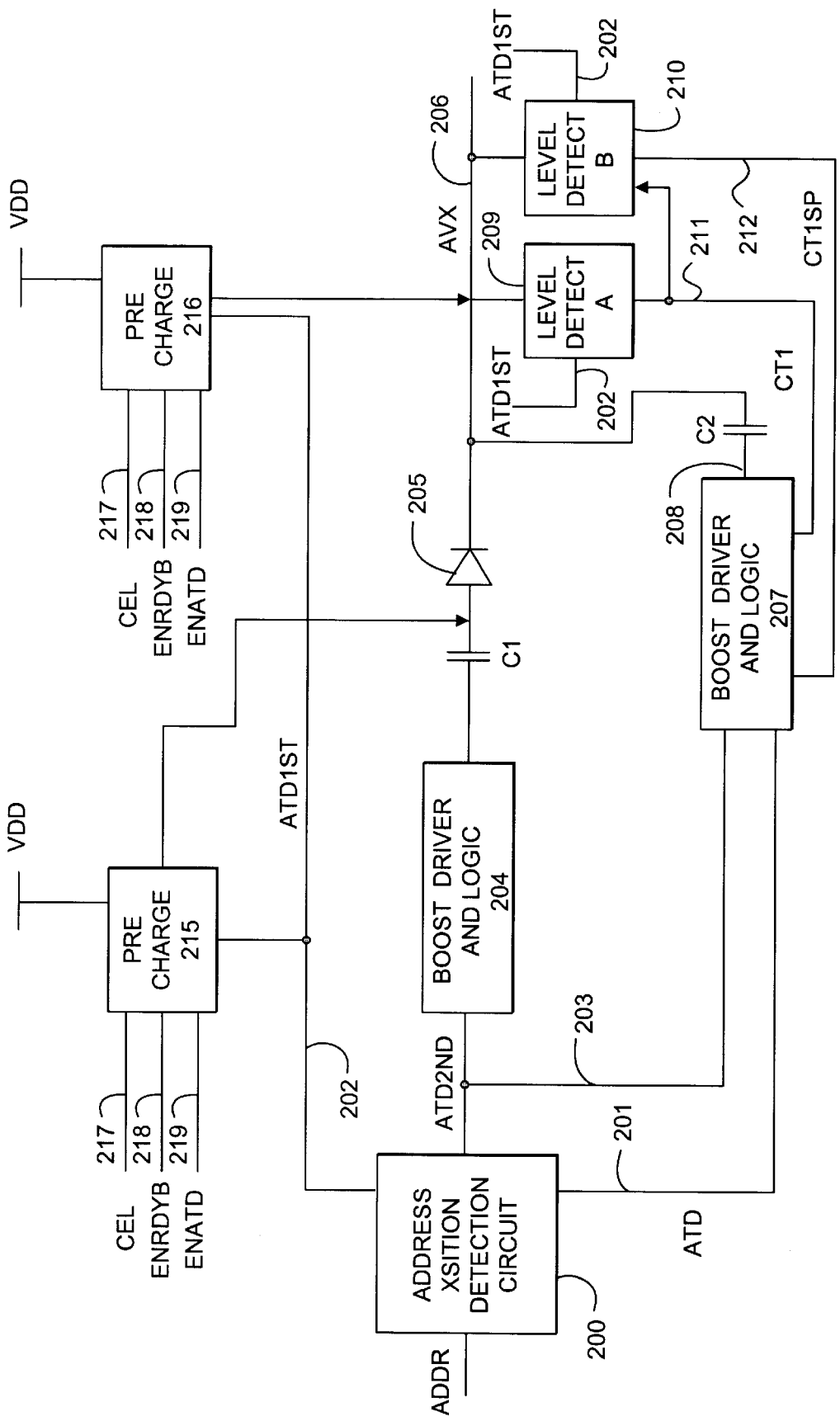
FIG. 2 is a block diagram of the wordline boost circuit of the present invention for use in the system of FIG. 1.

FIG. 2 provides a schematic block diagram of a wordline voltage boost circuit according to the present invention. The circuit includes an address transition detection circuit 200 which receives as input the addresses on the integrated circuit, and produces as output an address transition detection signal ATD on line 201, a first address transition detection pulse ATD1ST on line 202, and a second address transition detection pulse ATD2ND on line 203. The second pulse ATD2ND on line 203 is connected to a first stage boost driver and logic block 204 which includes a pump capacitor C1. The pump capacitor is connected to the anode of diode 205. The cathode of diode 205 is connected to the node 206 at which the voltage AVX is generated. A second stage boost driver and logic block 207 is also connected to receive the pulse ATD2ND on line 203 and the address transition detection signal ATD on line 201. The output of the second stage block 207 provides a boost signal on line 208 to a capacitor C2. A second terminal of the capacitor is coupled to the node 206. A first level detector 209 and a second level detector 210 are coupled to the node 206, and generate a first control signal CT1 on line 211 and a second control signal CT1SP on line 212, respectively. These signals are supplied to the second stage block 207 and control the rate of charging of the capacitor C2 in response to the transition of the boost signal on line 208.

The wordline voltage generator in FIG. 2 also includes a first pre-charge circuit 215 and a second pre-charge circuit 216. The first and second pre-charge circuits 215, 216 pre-charge the anode of diode 205 and the node 206 to a level near the supply potential in order to facilitate the boosting process. Control signals, including the chip enable CEL signal on line 217, an enable ready signal ENRDYB on line 218, and an enable address transition detection signal ENATD on line 219 are supplied to the pre-charge circuits. In addition, the pre-charge circuits are responsive to the first address transition pulse ATD1ST on line 202.

Figure 3:
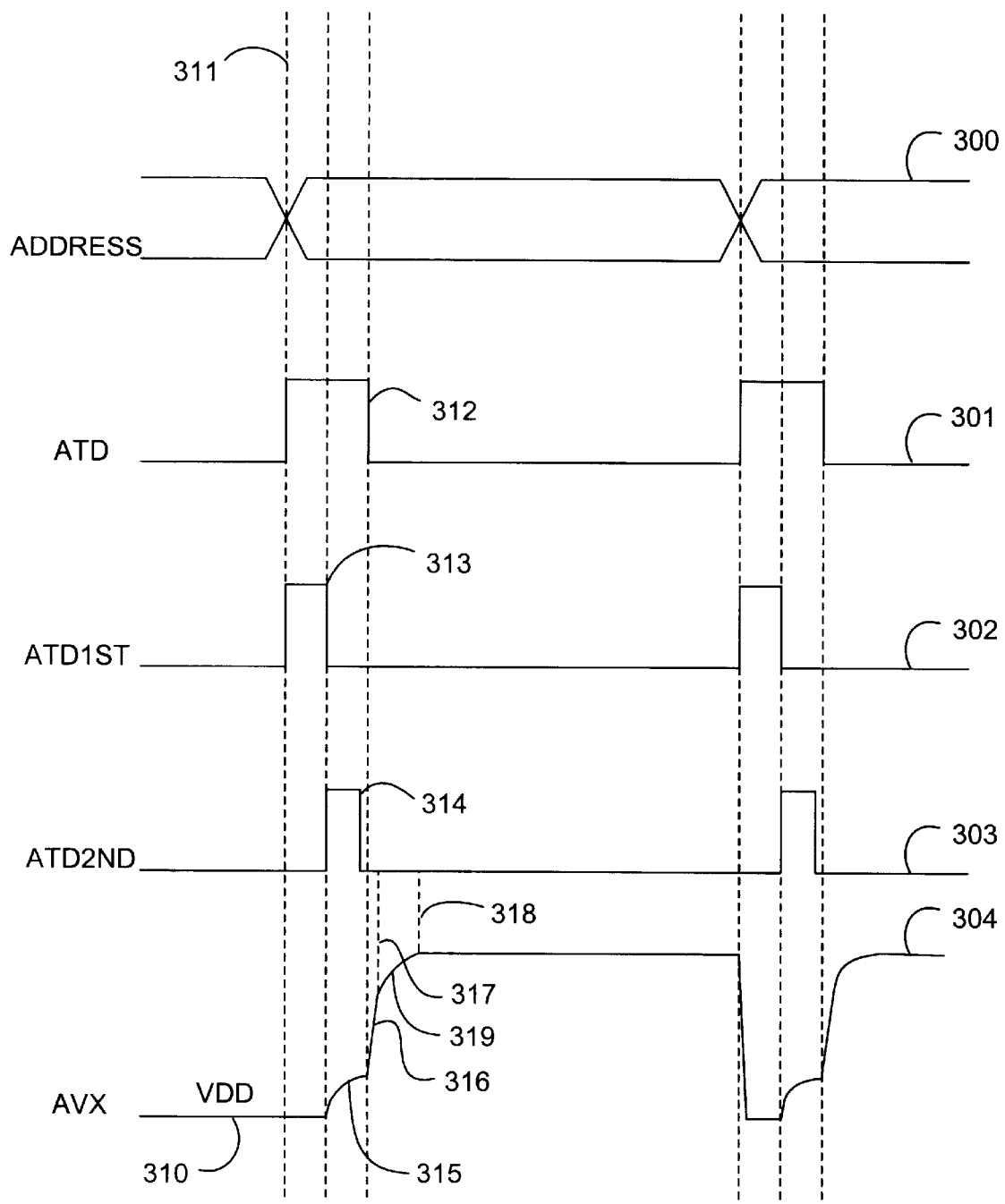
FIG. 3 is a timing diagram used for describing the operation of the present invention.

FIG. 3 is a timing diagram for the address transition detection signals and the level of the AVX signal on node 206.

In FIG. 3, the addresses input to the address transition detection signal are indicated at trace 300. The address transition detection signal on line 201 is indicated on trace 301, the first address transition detection pulse ATD1ST is indicated on trace 302, and the second address transition detection pulse ATD2ND is indicated on trace 303. The level of the voltage AVX at node 206 is indicated at trace 304.

In this example, the level of the AVX signal on line 304 starts at about the supply potential level of VDD as indicated at point 310. At time 311, the addresses change at the input of the integrated circuit. This causes an address transition detection signal to transition to the high state at time 311, and to transition to the low state at time 312. The interval of the ATD signal on line 301 between times 311 and 312 is about 20 nanoseconds in this example. The address transition detection circuit 200 produces a first pulse beginning at time 311 and ending at time 313 as indicated by the ATD1ST signal on line 302. The ATD2ND signal transitions to the high state at time 313 and transitions to the low state at time 314 which is close to time 312.

The boosting of the node AVX begins with the pre-charging caused by the ATD1ST pulse at time 311. In the trace 304 of FIG. 3, this pre-charging does not reflect any change in the level of the AVX signal. However, if the AVX signal had not been pre-charged to the VDD level prior to the ATD signal, then its level would have been brought up to near VDD. The pre-charge circuit also pre-conditions the capacitor C1 for boosting above the VDD level.

At the rising edge of the ATD2ND signal at time 313, first stage boost pump causes a transition on capacitor C1. This boosts the anode of diode 205, above the level of node 206, and induces an increase in the AVX signal as indicated by the region 315 between times 313 and 312.

On the falling edge of the ATD signal at time 312, second stage boost pump begins a high speed transition of the boost signal 208 in the steep region 316 of the trace 304 just after time 312. At time 317, voltage level detector B 210 detects that the AVX signal has crossed a first threshold. This causes the second stage boost pump to switch to a slower rate of boosting as indicated by the region 319 in the trace 304 just after time 317.

At time 318, level detector A 209 detects that the voltage level AVX has reached a final threshold and produces the control signal CT1 on line 211. This causes the boosting speed of the second stage pump 207 to stop.

The interval between time 312 and 317 of the rapid boosting in this example is less than about 2 nanoseconds, or less than about 5 nanoseconds. The interval for the slower boosting during trace 319 between time 317 and 318 is less than about 10 nanoseconds, or less than about 20 nanoseconds.

Overall the slower boosting rate during the interval 319 allows greater time for feedback circuits controlling the final level of the AVX signal to be more accurate. The faster boosting rate during interval 316 speeds up the boosting process significantly without sacrificing accuracy in the cutoff level.

Figure 4:
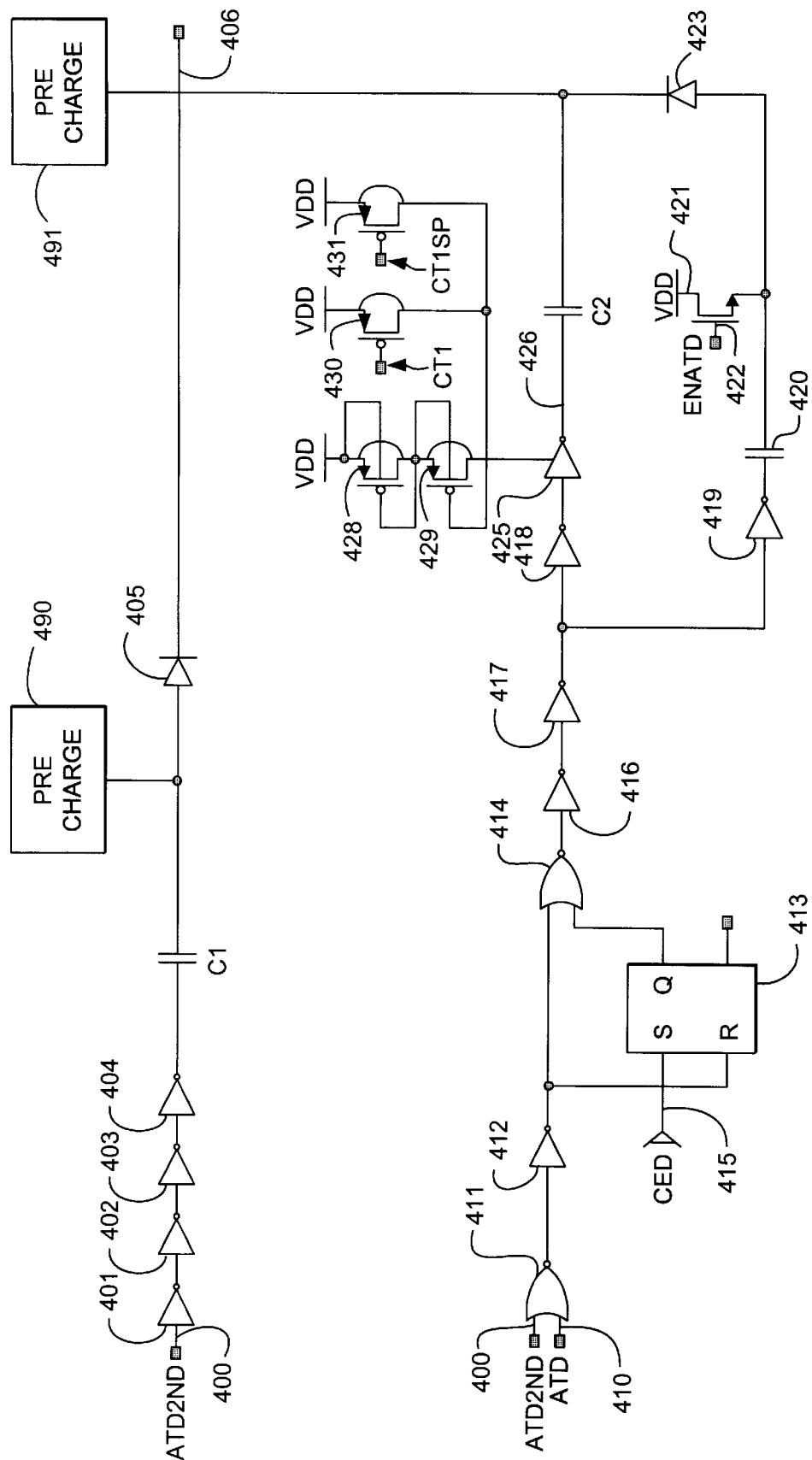
FIG. 4 is a circuit diagram of a preferred embodiment of the boosting circuits according to the present invention.

FIGS. 4, 5, 6, 7, 8 and 9 provide a detailed circuit diagram of the voltage boosting circuit in a preferred embodiment of the present invention. FIG. 4 illustrates the first stage pump and the second stage pump. The first stage pump receives the second pulse ATD2ND on line 400. This signal is supplied through inverter 401, inverter 402, inverter 403, and inverter 404 to a first terminal of capacitor C1. Thus, on the rising edge of the pulse ATD2ND on line 400, the signal on the first terminal of capacitor C1 transitions from a low value to a high value. The second terminal of capacitor C1 is connected to the anode of diode 405. The cathode of diode 405 is connected to node 406 at which the AVX voltage is generated.

The second stage of the pump includes the second pulse ATD2ND on line 400 as well as the address transition detection signal ATD on line 410. These signals are supplied as inputs to a NOR gate 411 which supplies the input to an inverter 412. The output of inverter 412 is supplied to the reset input of a set-reset SR latch 413, and as one input to a NOR gate 414. An active low chip enable signal CEB 415 is supplied to the set input of the SR latch 413. The output of the SR latch is a second input of the NOR gate 414. The output of NOR gate 414 drives inverter 416 which in turn drives inverter 417. Inverter 417 supplies inputs to inverter 418 and to inverter 419. The output of inverter 419 is coupled to a first terminal of capacitor 420. The second terminal capacitor 420 is connected to the source of n-channel transistor 421. The drain of n-channel transistor 421 is connected to the supply potential VDD. The gate of transitor 421 receives a control signal ENATD on line 422. Also, the capacitor 420 is connected to the anode of a diode 423. The cathode of diode 423 is connected to the node 406. The control signal on line 422 pulls up the anode of diode 423 to the supply potential level during operation of the pump circuit. The circuit including the inverter 419, the capacitor 420 and the transistor 421 coupled through diode 423 to node 406 operates in a pre-charge capacity. When the ENATD signal is low, and the CEB sets the latch 413, causing a transition on the output of inverter 419. This boosts across capacitor 420 and diode 423 the node 406 to a pre-charge level to assist the pre-charging function.

When the address transition detection enable signal is high, boosting is enabled through the inverter 418. Inverter 418 drives a two mode inverter 425. The output of the two mode inverter is a boost signal on line 426 coupled to a capacitor C2. The second node of the capacitor C2 is supplied to the terminal 406. The two mode driver 425 has a power supply terminal which is connected to the current source circuit including transistors 428, 429, 430 and 431. In this example transistors 428 and 429 consist of p-channel transistors having a width of 3 microns and a length of 5 microns. The gate and drain of transistors 428 and 429 are coupled together in respective diode configurations. The n-wells of the transistors are coupled to their respective sources. These transistors provide a weak pull-up to the power supply terminal of driver 425 to prevent it from floating.

Transistors 430 and 431 establish the two rates of boosting of the boost signal on line 426. In this example, transistor 430 has a width of about one-fifth the width of transistor 431 (e.g. 50 microns) and a length of about 0.5 microns. Transistor 430 is a p-channel transistor having the control signal CT1 coupled to its gate. Transistor 431 is a p-channel transistor having the control signal CT1SP coupled to its gate. Transistor 431 has a width of about five times the width of transistor 430 (e.g. 250 microns) and a length of about 0.5 microns. Thus, transistor 431 controlled by CT1SP is much stronger than transistor 430 controlled by CT1. The drains of transistors 430 and 431 are both coupled to the power supply terminal of the driving inverter 425. When both CT1 and CT1SP are low, a very fast rate of boosting is produced in the boost signal 426 as reflected by the interval 316 between times 312 and 317 in trace 304 of FIG. 3. When the control signal CT1SP goes high, transistor 431 is turned off and the rate of boosting is reduced substantially, driven only by transistor 430. This is reflected in the slower rate of boosting during the interval 319 between times 317 and 318 in the trace 304 of FIG. 3.

The rate of boosting on the signal at node 426 is directly reflected across capacitor C2 on node 406 in a way which is illustrated in FIG. 3 at trace 304.

Figure 5:
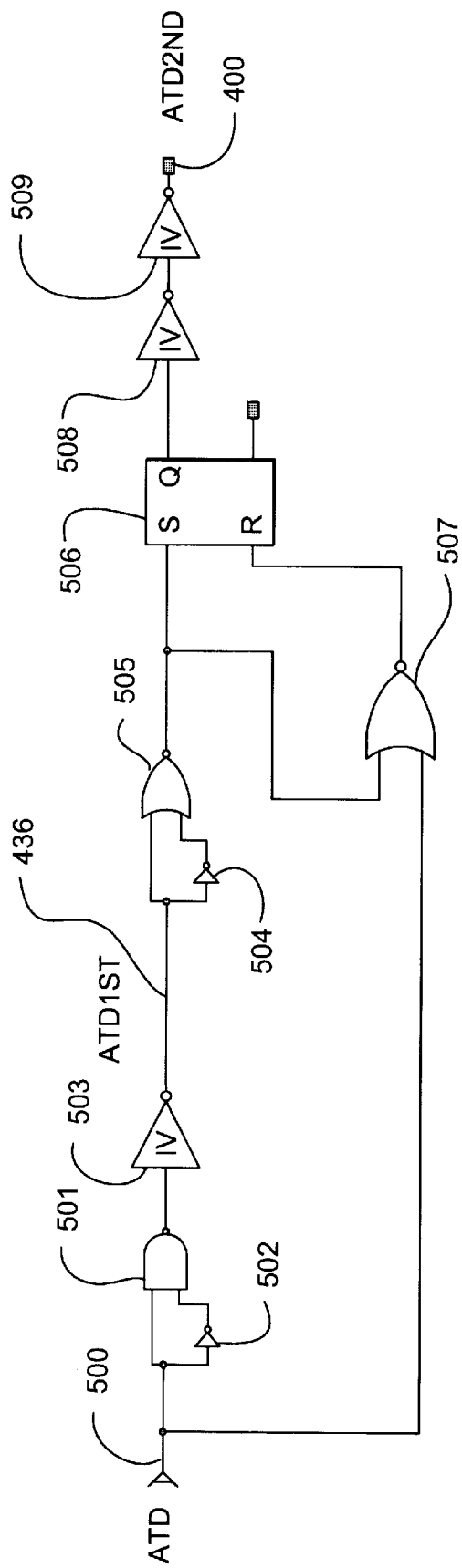
FIG. 5 is a circuit diagram of logic used for generating the transition signals used by the boosting circuit of FIG. 4.
Figure 6:
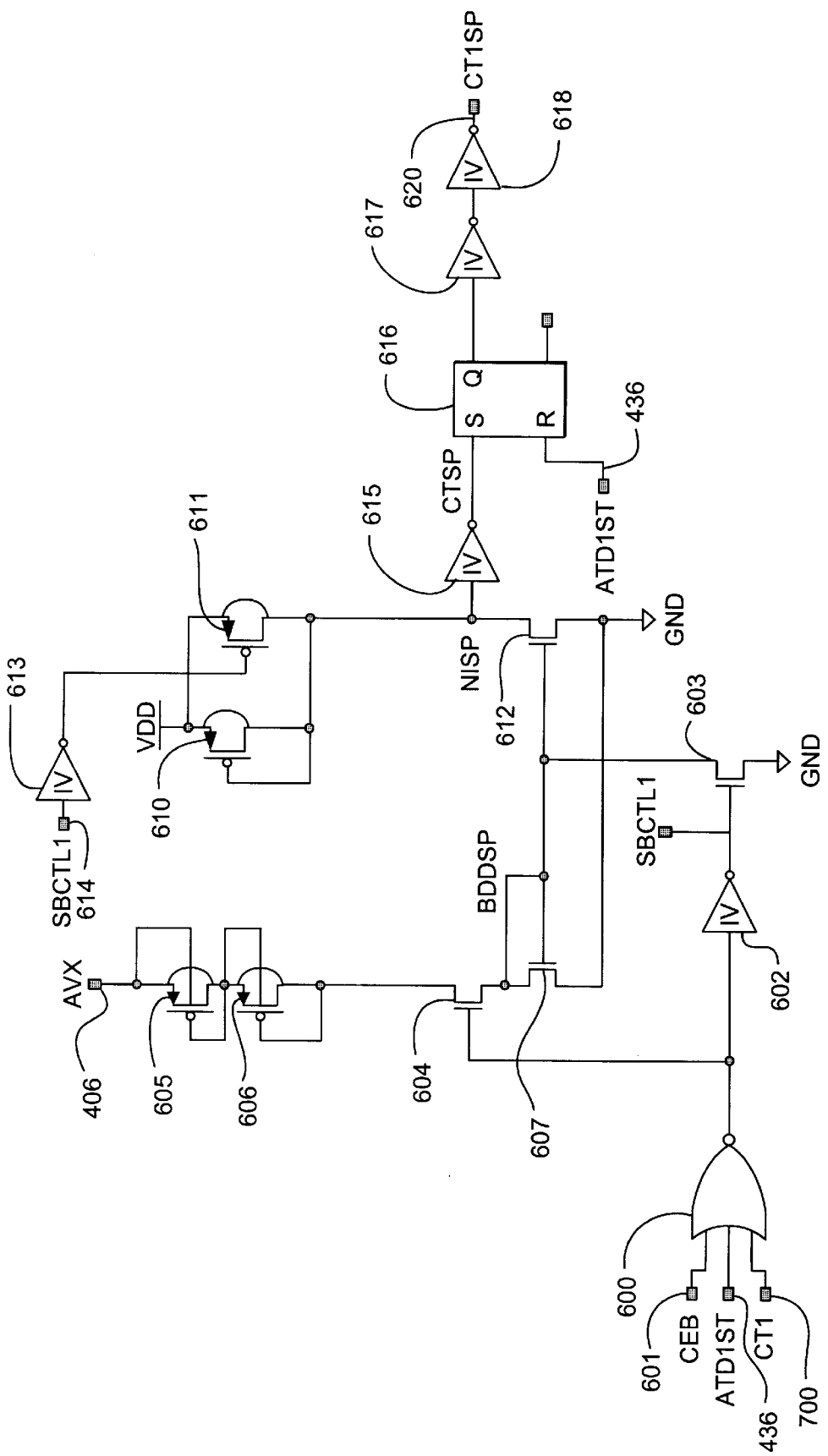
FIG. 6 is a circuit diagram of a voltage level detector used in combination with the circuit of FIG. 4.
Figure 7:
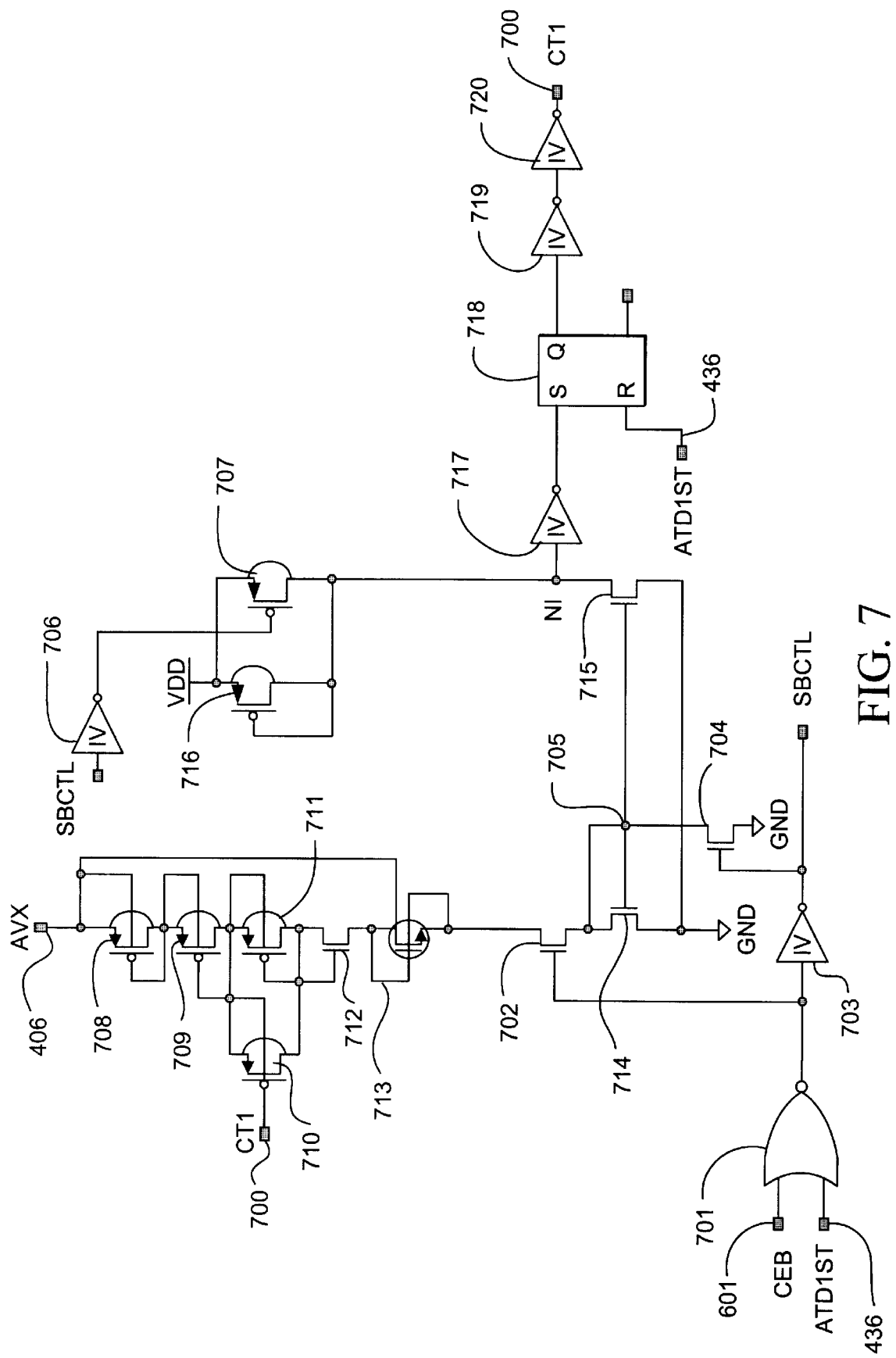
FIG. 7 is a circuit diagram of a second voltage level detector used with the circuit of FIG. 4.

The CT1 and CT1SP control signals at the gates of transistors 430 and 431 are produced by the level detectors illustrated in FIGS. 6 and 7. The ATD 1ST pulse and the ATD2ND pulse are generated by the circuit illustrated in FIG. 5.

Figure 8:
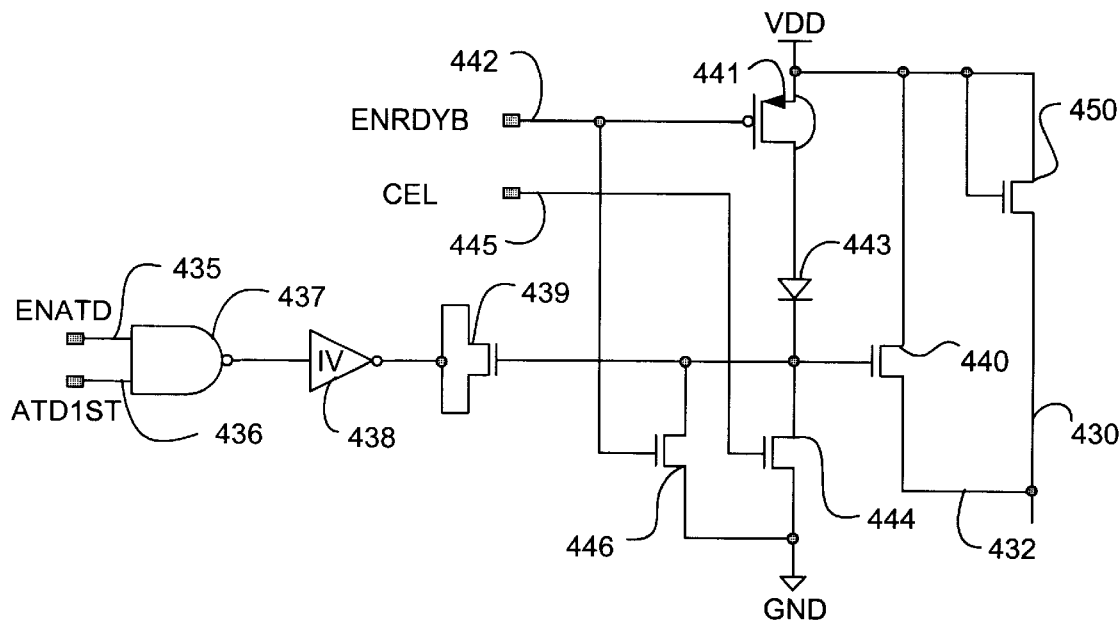
FIG. 8 is a circuit diagram of a pre-charge circuit used with the circuit of FIG. 4.
Figure 9:
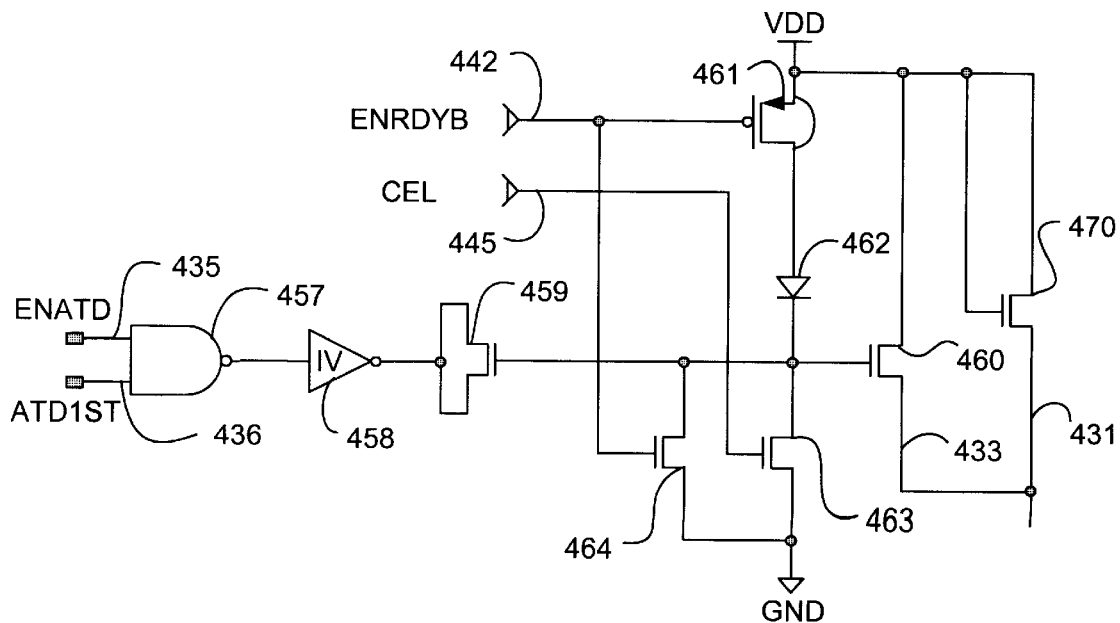
FIG. 9 is a circuit diagram of a second pre-charge circuit used with the circuit of FIG. 4.

Pre-charge circuits shown in FIGS. 8 and 9 used for setting up the boosting operation in the circuit are coupled to the boost circuit. The first pre-charge circuit 490 is coupled to the anode of diode 405. A second pre-charge circuit 491 is coupled to node 406 at the cathode of diode 405.

The ENRDYB, CEL, CEB, and ENATD control signals are control signal produced with logic of standard design.

In FIG. 5, the ATD1ST and the ATD2ND signals are generated in response to an address transition detect ATD signal on line 500. The ATD signal is produced for example as illustrated in our co-pending U.S. patent application Ser. No. 08/751,513 entitled AN ADDRESS TRANSITION DETECTION CIRCUIT filed Nov. 15, 1996, invented by Yin Liu, et al., which was owned at the time of invention and is currently owned by the same assignee. Upon the transition of an address signal, an ATD pulse of about 20 nanoseconds is generated in the preferred system, as shown in FIG. 3. This signal is applied to an one shot circuit consisting of NAND gate 501 and inverter 502. The input the ATD signal line 500 is connected to the input of the inverter 502 and to one input of NAND gate 501. The output of the inverter 502 is connected to the second input of NAND gate 501. The output of the NAND gate 501 is supplied to an inverter 503.

The output of the inverter 503 supplies the ATD1ST signal on line 436. The ATD1ST signal is supplied to a second one shot circuit including inverter 504 and NOR gate 505. The ATD1ST signal is connected to the input of inverter 504 which has its output connected to an input of NOR gate 505. Also, the ATD1ST signal is connected to the second input of NOR gate 505. The output of the NOR gate 505 is connected to the set input of an SR latch 506. In addition, the output of the NOR gate 505 is connected as one input to NOR gate 507. The second input to NOR gate 507 is the ATD signal on line 500. The output of NOR gate 507 is connected to the reset input of the SR latch 506. The Q output of SR latch 506 is connected to inverter 508, which in turn drives inverter 509. The output of inverter 509 is the ATD2ND signal on line 400.

The first level detector illustrated in FIG. 6 generates the CT1SP signal. The second level detector illustrated in FIG. 7 generates the CT1 signal. The CT1SP signal triggers at a lower level of AVX than does the CT1 signal. The detector in FIG. 6 is enabled by the output of the NOR gate 600 which receives as inputs the CEB signal on line 601, the ATD1ST signal on line 436, and the CT1 signal on line 700. The output of the NOR gate 600 is connected through inverter 602 to the gate of transistor 603. Also, the output of inverter 600 is connected to the gate of transistor 604. When the output of NOR gate 600 is high, transistor 604 is turned on and transistor 603 is turned off enabling operation of the level detector circuit.

The level detector circuit includes a first current leg which receives as input the AVX signal from node 406. This node is connected to the source and n-well of p-channel transistor 605. The gate and drain of p-channel transistor 605 are connected to the source and n-well of p-channel transistor 606. The gate and drain of transistor 606 are connected to the drain of transistor 604. The source of transistor 604 is connected to the drain and gate of n-channel transistor 607. The source of n-channel transistor 607 is connected to ground.

The second current leg of the level detector includes a first node connected to the supply potential VDD. A p-channel transistor 610 and a p-channel transistor 611 have their sources connected to the supply potential. The gate and drain of transistor 610 are connected to the drain of transistor 612. The gate of transistor 611 is connected to the output of inverter 613 which receives as input the SBCTL1 signal on line 614, which is supplied from the output of inverter 602. Thus, when the SBCTL1 signal is high, the signal on the gate of transistor 611 is low, enabling an increased current flow through the circuit.

The source of transistor 612 is connected to ground. The gate of transistor 612 is connected to the gate of transistor 607 in a current mirror fashion. Also, the gate of transistor 612 and the gate of transistor 607 are connected to the drain of transistor 603. The node NISP on the drain of transistor 612 is connected as input to an inverter 615. The output of inverter 615 is connected to the S input of an SR latch 616. The reset input of the SR latch 616 is connected to receive the ATD1ST signal on line 436. The Q output of SR latch 616 is connected to inverter 617 which drives inverter 618. The output of inverter 618 is the control signal CT1SP on line 620. In operation, as the signal AVX increases, the current through the current mirror legs of the detector increases. As the current through the transistors 610 increases, so does the voltage NISP drop. When the voltage NISP drops below the trip point of inverter 615, the latch 616 is set to produce the CT1SP signal.

FIG. 7 illustrates the level detector for generation of the CT1 signal. This level detector is enabled by the output of a NOR gate 701 which receives the CEB signal on line 601, and the ATD1ST signal on line 436. The output of the NOR gate 701 is connected to the gate of n-channel transistor 702 and to the input of inverter 703. The output of the inverter 703 is connected to the gate of n-channel transistor 704. The drain of transistor 704 is connected to the node 705. The source of transistor 704 is connected to ground. Thus when the output of the NOR gate 701 goes high, the circuit is enabled by turning off transistor 704 and turning on transistor 702. In addition, the output of the inverter 703 generates the control signal SBCTL which is supplied to the input of inverter 706. A high level on the input of inverter 706 turns on transistor 707.

The level detector includes a first current leg connected to the voltage AVX on node 406. Node 406 is connected to the source and n-well of p-channel transistor 708. The gate and drain of transistor 708 are coupled to the source and n-well of p-channel transistor 709. The gate and drain of transistor 709 are connected to the source and n-well of transistor 710 and to the source and n-well of transistor 711. The gate of transistor 710 is connected to receive the control signal CT1 on line 700. The gate and drain of transistor 711 and the drain of transistor 710 are connected to the gate and drain of n-channel transistor 712. The source of transistor 712 is coupled to the gate and drain of a triple well n-channel transistor 713. The isolation well of transistor 713 is connected to the AVX node 406. The p-well and source of transistor 713 are connected to the drain of transistor 702. The source of transistor 702 is connected to the drain and gate of transistor 714 at node 705. The source of transistor 714 is connected to ground.

The second current leg of the level detector includes transistor 707 which has its source connected to the supply potential and its drain connected to the drain of transistor 715. The source of transistor 715 is connected to ground. The gate of transistor 715 is connected to node 705 in common with transistor 714. In addition, transistor 716 has its source connected to the supply potential and its gate and drain connected to the drain of transistor 715.

The circuit works in a manner described above with respect to FIG. 6, except at a higher threshold. Thus, as the voltage level AVX increases, the current through the current mirror legs increases. When the current reaches a certain level, the voltage on node NI at the input of inverter 717 reaches the trip point of the inverter. The output of the inverter 717 is connected to the set input of an SR latch 718. The Q output of the SR latch 718 is connected to inverter 719 which in turn drives inverter 720. The output of inverter 720 is the CT1 signal on line 700. The reset input of the SR latch 718 receives the ATD1ST signal on line 436.

The transistor 710 operates to turn off when the CT1 signal goes high. This reduces the current flow through the level detector and conserves power for the circuit.

The level detection circuits illustrated here consist of the preferred embodiment. There are a variety of level detection circuit approaches which could be utilized according to the present invention. It can be appreciated that as the voltage level of AVX increases rapidly during the first stage of pumping according to the present invention, and that the delay on the order of a fraction of a nanosecond involved in detecting the level shift of AVX using the circuits of FIGS. 6 and 7, or other types of level detectors, is significant in accurate cutoff. The ability to tune the timing of these detectors within a nanosecond or less in order to cutoff the boosting level of the AVX signal at a preferred predetermined level is overcome according to the present invention by slowing down the boosting rate as the level reaches the desired cutoff. This way, the relative timing of the CT1SP signal and the reaching of the final level of the boosting is less critical. An overshoot condition is avoided according to the present invention while rapid boosting is allowed.

FIG. 8 illustrates the first pre-charge circuit 490. It receives as input signals an enable ATD signal on line 435 and the first ATD pulse ATD1ST on line 436. These signals are supplied as inputs to a NAND gate 437 the output of which drives inverter 438. The output of the inverter 438 is connected to the source and drain of a capacitor-connected transistor 439. The gate of transistor 439 is connected to the gate of n-channel transistor 440. The source of n-channel transistor 440 is connected to line 432 which is coupled to the anode of diode 405, and the drain of transistor 440 is connected to the supply potential VDD. The gate of transistor 440 is biased by a circuit including p-channel transistor 441 which has its source connected to the supply potential VDD, its gate connected to the control signal ENRDYB on line 442, and its drain connected to the anode of a diode 443. The cathode of diode 443 is connected to the gate of transistor 440. A transistor 444 has its drain connected to the gate of transistor 440 and its source connected to ground. The gate of transistor 444 is connected to the control signal CEL on line 445. In addition, a transistor 446 has its drain connected to the gate of transistor 440 and its source connected to ground. The gate of transistor 446 is connected to the control signal ENRDYB on line 442. In operation, the gate of transistor 440 in response to a low signal at the ENRDYB terminal on line 442 is coupled to a level which is determined by the voltage drop across transistor 441 and diode 443 below the supply potential. When the control signal CEL on line 445 goes high, the node is connected to ground. Similarly, when the control signal ENRDYB goes high, the node is connected to ground through transistor 446.

In addition, the pre-charge circuit includes transistor 450 which has its gate and drain coupled to the supply potential and its source connected across line 430 to the anode of diode 405. This diode connected transistor 450 maintains the level of the node at a threshold drop below VDD as a starting point. In response to the ATD1ST pulse, the gate of transistor 440 is boosted to compensate for the threshold drop across transistor 440 and 450 to pull the anode of diode 405 up to the VDD level.

The second pre-charge circuit is shown in FIG. 9, and is similar to the first. It receives its inputs ENATD signal on line 435 and the ATD1ST signal on line 436. These signals are supplied as inputs to a NAND gate 457 which drives inverter 458. The inverter 458 is connected to the source and drain of a capacitor connected transistor 459. The gate transistor 459 is connected to the gate of transistor 460. The gate of transistor 460 is also biased by the circuit including the p-channel transistor 461 having its source connected to the supply potential VDD and its drain connected through diode 462 to the gate transistor 460. Transistors 463 and 464 are n-channel transistors having their drains connected to the gate of transistor 460 and their sources connected to ground. The gate of transistor 463 receives the CEL control signal on line 445. The gate of transistor 461 and the gate of transistor 464 receive as input the control signal ENRDYB on line 442.

The second pre-charge circuit also includes transistor 470 which has its gate and drain connected to the supply potential VDD and its source connected on line 431 to node 406.

In this example circuit, the relative sizes and parameters of circuit components of FIGS. 4–9 are provided in the following table:

| Component | Parameters |
|---|---|
| Capacitor C1 | 150 picofarads |
| Capacitor C2 | 250 picofarads |
| Capacitor 420 | 40 picofarads |
| Inverter 425 | p-channel width: 250 microns |
| | p-channel width: 0.5 microns |
| | n-channel width: 250 microns |
| | n-channel width: 0.5 microns |
| Transistor 430 | width: 50 microns |
| | length: 0.5 microns |
| Transistor 431 | width: 250 microns |
| | length: 0.5 microns |
| Transistor 421 | width: 460 microns |
| | length: 1.3 microns |
| Transistor 441 | width: 10 microns |
| | length: 0.5 microns |
| Transistor 440 | width: 950 microns |
| | length: 1.3 microns |
| Transistor 450 | width: 95 microns |
| | length: 1.3 microns |
| Transistor 439 | width: 91.4 microns |
| | length: 46 microns |
| Transistor 446 | width: 4 microns |
| | length: 1 microns |
| Transistor 444 | width: 2 microns |
| | length: 30 microns |
| Transistor 459 | width: 91.4 microns |
| | length: 46 microns |
| Transistor 464 | width: 4 microns |
| | length: 1 microns |
| Transistor 463 | width: 2 microns |
| | length: 30 microns |
| Transistor 461 | width: 10 microns |
| | length: 0.5 microns |
| Transistor 460 | width: 940 microns |
| | length: 1.3 microns |
| Transistor 470 | width: 47 microns |
| | length: 1.3 microns |
| Transistor 605 | width: 200 microns |
| | length: 1.5 microns |
| Transistor 606 | width: 200 microns |
| | length: 1.5 microns |
| Transistor 604 | width: 200 microns |
| | length: 1.5 microns |
| Transistor 607 | width: 50 microns |
| | length: 1 microns |
| Transistor 610 | width: 3 microns |
| | length: 50 microns |
| Transistor 611 | width: 20 microns |
| | length: 0.5 microns |
| Transistor 612 | width: 300 microns |
| | length: 1 microns |
| Transistor 702 | width: 200 microns |
| | length: 1.5 microns |
| Transistor 708 | width: 200 microns |
| | length: 1.5 microns |
| Transistor 709 | width: 200 microns |
| | length: 1.5 microns |
| Transistor 710 | width: 50 microns |
| | length: 1.5 microns |
| Transistor 711 | width: 200 microns |
| | length: 1.5 microns |
| Transistor 712 | width: 200 microns |
| | length: 1.5 microns |
| Transistor 714 | width: 50 microns |
| | length: 1 microns |
| Transistor 707 | width: 20 microns |
| | length: 0.5 microns |
| Transistor 716 | width: 3 microns |
| | length: 50 microns |
| Transistor 715 | width: 300 microns |
| | length: 1 microns |

The transistor sizes and capacitor parameters set forth above are representative of a particular implementation designed according to the needs of a specific semiconductor device. Obviously variations in the components and relative sizes of these transistors may be appropriate for any given circumstance. However they are given as a basis for understanding the operation of the example circuit in more detail.

Accordingly, a two mode voltage boosting circuit suitable for use in read operations for flash memory and other memory devices has been disclosed. The circuit is also suitable for other environments where a rapid boosting with a precise cutoff level is desired. For example, the precise cutoff level is particularly important for multi-level cells which rely on very tight margin on the wordline voltages for reading the various levels of the cell.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in the art. It is not intended that the scope of the invention be defined by the following claims and their equivalents.

What is claimed is:

1. An integrated circuit having a supply voltage input adapted to receive a supply voltage within a prespecified range of voltages, and including components on the integrated circuit using an on chip voltage higher than the prespecified range, comprising:

a voltage boost circuit coupled to the supply voltage input and to a boost signal, which boosts the on chip voltage at a node on the integrated circuit in response to a transition of the boost signal, the voltage boost circuit having a first mode which in response to the transition, boosts the on chip voltage at a first rate of boosting until a first threshold, and a second mode which boosts the on chip voltage at a second rate of boosting after the first threshold until a second threshold, the second rate slower than the first rate; and a detection circuit, coupled to the node on the integrated circuit and to the voltage boost circuit, which signals the voltage boost circuit when the node reaches the first threshold, and signals the voltage boost circuit when the node reaches the second threshold;

wherein the voltage boost circuit comprises:

a capacitor having a first terminal coupled to the node on the integrated circuit, and having a second terminal;

a driving circuit coupled to the second terminal of the capacitor, the driving circuit supplying the transition to the second terminal of the capacitor by supplying current at a first rate during the first mode, and supplying current at a second rate during the second mode.

2. The integrated circuit of claim 1, wherein the driving circuit comprises:

an inverter, having an input connected to receive the boost signal, an output coupled to the second terminal of the capacitor, and first and second power supply terminals; and a current source coupled to one of the first and second power supply terminals having a first mode supplying current at the first rate, and having a second mode supplying current at the second rate.

3. An integrated circuit having a supply voltage input adapted to receive a supply voltage within a prespecified range of voltages and including components on the integrated circuit using an on chip voltage higher than the prespecified range, comprising:

a voltage boost circuit coupled to the supply voltage input and to a boost signal, which boosts the on chip voltage at a node on the integrated circuit in response to a transition of the boost signal, the voltage boost circuit having a first mode which in response to the transition, boosts the on chip voltage at a first rate of boosting until a first threshold, and a second mode which boosts the on chip voltage at a second rate of boosting after the first threshold until a second threshold, the second rate slower than the first rate; and a detection circuit, coupled to the node on the integrated circuit and to the voltage boost circuit, which signals the voltage boost circuit when the node reaches the first threshold, and signals the voltage boost circuit when the node reaches the second threshold;

wherein the voltage boosting circuit comprises:

a first stage including a first capacitor having a first terminal and a second terminal, a diode having an anode coupled to the second terminal of the capacitor and a cathode coupled to the node on the integrated circuit, and a driver coupled to the first terminal of the capacitor which supplies a first transition signal to the first capacitor; and a second stage including a second capacitor having a first terminal coupled to the node on the integrated circuit, and having a second terminal, a second driver coupled to the second terminal of the second capacitor, the second driver supplying the transition of the boost signal to the second terminal of the capacitor by supplying current at a first rate during the first mode, and supplying current at a second rate during the second mode.

4. The integrated circuit of claim 3, including a first precharge circuit coupled to the anode of the diode, and a second precharge circuit coupled to the node which precharge the first terminal of the second capacitor and the node to a starting voltage prior to the first transition signal.

5. The integrated circuit of claim 3, including logic responsive to an event to produce the first transition signal and the transition of the boost signal.

6. An integrated circuit memory having a supply voltage input adapted to receive a supply voltage within a prespecified range of voltages, comprising:

an array of memory cells;

a plurality of wordlines coupled to rows of memory cells in the array;

a plurality of bitlines coupled to columns of memory cells in the array;

a set of wordline drivers, coupled to the plurality of wordlines, the wordline drivers driving a wordline voltage on selected wordlines from a node on the integrated circuit, the wordline voltage higher than the prespecified range of the supply voltage;

logic which detects an event on the integrated circuit and produces a transition of a boost signal;

a voltage boost circuit coupled to the supply voltage input and receiving the boost signal, which boosts the wordline voltage at the node on the integrated circuit in response to a transition of the boost signal, the voltage boost circuit having a first mode which in response to the transition, boosts the on chip voltage at a first rate of boosting until a first threshold, and a second mode which boosts the on chip voltage at a second rate of boosting after the first threshold until a second threshold, the second rate slower than the first rate; and a detection circuit, coupled to the node on the integrated circuit and to the voltage boost circuit, which signals the voltage boost circuit when the node reaches the first threshold, and signals the voltage boost circuit when the node reaches the second threshold;

wherein the voltage boost circuit comprises:

a capacitor having a first terminal coupled to the node on the integrated circuit, and having a second terminal;

a driving circuit coupled to the second terminal of the capacitor, the driving circuit supplying the transition to the second terminal of the capacitor by supplying current at a first rate during the first mode, and supplying current at a second rate during the second mode.

7. The integrated circuit of claim 6, wherein the driving circuit comprises:

an inverter, having an input connected to receive the boost signal, an output coupled to the second terminal of the capacitor, and first and second power supply terminals; and a current source coupled to one of the first and second power supply terminals having a first mode supplying current at the first rate, and having a second mode supplying current at the second rate.

8. An integrated circuit memory having a supply voltage input adapted to receive a supply voltage within a prespecified range of voltages, comprising:

an array of memory cells;

a plurality of wordlines coupled to rows of memory cells in the array;

a plurality of bitlines coupled to columns of memory cells in the array;

a set of wordline drivers, coupled to the plurality of wordlines, the wordline drivers driving a wordline voltage on selected wordlines from a node on the integrated circuit, the wordline voltage higher than the prespecified range of the supply voltage;

logic which detects an event on the integrated circuit and produces a transition of a boost signal;

a voltage boost circuit coupled to the supply voltage input and receiving the boost signal, which boosts the wordline voltage at the node on the integrated circuit in response to a transition of the boost signal, the voltage boost circuit having a first mode which in response to the transition, boosts the on chip voltage at a first rate of boosting until a first threshold, and a second mode which boosts the on chip voltage at a second rate of boosting after the first threshold until a second threshold, the second rate slower than the first rate; and a detection circuit, coupled to the node on the integrated circuit and to the voltage boost circuit, which signals the voltage boost circuit when the node reaches the first threshold, and signals the voltage boost circuit when the node reaches the second threshold;

wherein the voltage boosting circuit comprises:

a first stage including a first capacitor having a first terminal and a second terminal, a diode having an anode coupled to the second terminal of the capacitor and a cathode coupled to the node on the integrated circuit, and a driver coupled to the first terminal of the capacitor which supplies a first transition signal to the first capacitor; and a second stage including a second capacitor having a first terminal coupled to the node on the integrated circuit, and having a second terminal, a second driver coupled to the second terminal of the second capacitor, the second driver supplying the transition of the boost signal to the second terminal of the capacitor by supplying current at a first rate during the first mode, and supplying current at a second rate during the second mode.

9. The integrated circuit of claim 8, including at least one address input, and wherein the logic comprises a circuit which produces the first transition signal transition in response to a transition on at least one address input, and the transition in the boost signal after the first transition signal.

10. The integrated circuit of claim 8, including a first precharge circuit coupled to the anode of the diode, and a second precharge circuit coupled to the node which precharge the first terminal of the second capacitor and the node to a starting voltage prior to the first transition signal.

11. The integrated circuit of claim 10, including at least one address input, and wherein the logic comprises a circuit which produces a precharge signal, the first transition signal after the precharge signal, and the transition in the boost signal after the first transition signal, in response to a transition on the at least one address input, and wherein the first and second precharge circuits are responsive to the precharge signal.

12. An integrated circuit memory having a supply voltage input adapted to receive a supply voltage within a prespecified range of voltages, comprising:

an array of memory cells;

at least one address input;

a plurality of wordlines coupled to rows of memory cells in the array;

a plurality of bitlines coupled to columns of memory cells in the array;

a set of wordline drivers, coupled to the plurality of wordlines, the wordline drivers driving a wordline voltage on selected wordlines from a node on the integrated circuit, the wordline voltage higher than the prespecified range of the supply voltage;

logic which detects an event on the integrated circuit and produces a precharge signal, a first transition of a boost signal after the precharge signal, and a second transition in the boost signal after the first transition, in response to a transition on the at least one address input, and wherein the first and second precharge circuits are responsive to the precharge signal;

a voltage boost circuit coupled to the supply voltage input and receiving the boost signal, which boosts the wordline voltage at the node on the integrated circuit, the voltage boost circuit having:

a first stage including a first capacitor having a first terminal and a second terminal, a diode having an anode coupled to the second terminal of the capacitor and a cathode coupled to the node on the integrated circuit, and a driver coupled to the logic and to the first terminal of the capacitor which supplies the first transition to the first capacitor; and a second stage including a second capacitor having a first terminal coupled to the node on the integrated circuit, and having a second terminal, a second driver coupled to the logic and to the second terminal of the second capacitor, the second driver supplying the second transition of the boost signal to the second terminal of the capacitor by supplying current at a first rate until a first threshold is reached, and supplying current at a second rate until a second threshold is reached, wherein the first threshold is reached in less than 5 nanoseconds of the second transition, and the second rate slower than the first rate;

a first precharge circuit coupled to the anode of the diode, and a second precharge circuit coupled to the node which precharge the first terminal of the second capacitor and the node to a starting voltage prior to the first transition signal; and a detection circuit, coupled to the node on the integrated circuit and to the voltage boost circuit, which signals the voltage boost circuit when the node reaches the first threshold, and signals the voltage boost circuit when the node reaches the second threshold; wherein the detection circuit includes:

a first detector coupled to the node, which supplies a first control signal to the voltage boost circuit within a first time interval of the node reaching the first threshold during which first time interval the voltage boost circuit continues boosting at the first rate; and a second detector coupled to the node, which supplies a second control signal to the voltage boost circuit within a second time interval of the node reaching the second threshold during which second time interval the voltage boost circuit continues boosting at the second rate, so that the wordline voltage at the node increase less during the second time interval than during the first time interval.

13. The integrated circuit of claim 12, wherein the second driver comprises:

an inverter, having an input connected to receive the boost signal, an output coupled to the second terminal of the second capacitor, and first and second power supply terminals; and a current source coupled to one of the first and second power supply terminals having a first mode supplying current at the first rate, and having a second mode supplying current at the second rate.

14. The integrated circuit of claim 12, wherein the array of memory cells comprises ROM cells.

15. The integrated circuit of claim 12, wherein the array of memory cells comprises floating gate memory cells.

16. The integrated circuit of claim 12, wherein the first threshold is reached in about 2 nanoseconds, or less, of the second transition.

* * * * *